United States Patent
Chen et al.

(10) Patent No.: US 9,859,338 B2
(45) Date of Patent: Jan. 2, 2018

(54) THREE-DIMENSIONAL RESISTIVE MEMORY

(71) Applicant: Winbond Electronics Corp., Taichung (TW)

(72) Inventors: Frederick Chen, Taichung (TW); Chia-Hua Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/075,215

(22) Filed: Mar. 21, 2016

(65) Prior Publication Data

US 2017/0271402 A1    Sep. 21, 2017

(51) Int. Cl.
*H01L 27/24* (2006.01)
*H01L 45/00* (2006.01)

(52) U.S. Cl.
CPC ........ *H01L 27/249* (2013.01); *H01L 27/2454* (2013.01); *H01L 45/085* (2013.01); *H01L 45/1233* (2013.01); *H01L 45/1266* (2013.01); *H01L 45/145* (2013.01); *H01L 45/1616* (2013.01)

(58) Field of Classification Search
CPC ............... H01L 27/2454; H01L 27/249; H01L 45/1616; H01L 45/145; H01L 45/1266; H01L 45/085; H01L 45/1233
See application file for complete search history.

(56) References Cited

U.S. PATENT DOCUMENTS

| 8,026,521 B1 | 9/2011 | Or-Bach et al. |
| 8,247,788 B2 | 8/2012 | Seol et al. |
| 9,093,369 B2 | 7/2015 | Shin et al. |
| 9,245,588 B2 | 1/2016 | Park |

(Continued)

FOREIGN PATENT DOCUMENTS

| JP | 2008078404 | 4/2008 |
| JP | 2011527515 | 10/2011 |

(Continued)

OTHER PUBLICATIONS

"Search Report of European Counterpart Application," dated Jun. 22, 2017, p. 1-p. 13.

(Continued)

*Primary Examiner* — Allen Parker
*Assistant Examiner* — Ismail Muse
(74) *Attorney, Agent, or Firm* — JCIPRNET

(57) ABSTRACT

Provided is a three-dimensional resistive memory including a channel pillar, a first gate pillar, a first gate dielectric layer, first and second stacked structures, a variable resistance pillar and an electrode pillar. The channel pillar is on a substrate. The first gate pillar is on the substrate and at a first side of the channel pillar. The first gate dielectric layer is between the channel pillar and the first gate pillar. The first and second stacked structures are on the substrate and respectively at opposite second and third sides of the channel pillar. Each of the first and second stacked structures includes conductive material layers and insulating material (Continued)

layers alternately stacked. The variable resistance pillar is on the substrate and at a side of the first stacked structure opposite to the channel pillar. The electrode pillar is on the substrate and inside of the variable resistance pillar.

13 Claims, 11 Drawing Sheets

(56) References Cited

U.S. PATENT DOCUMENTS

| | | | | |
|---|---|---|---|---|
| 2004/0090815 | A1* | 5/2004 | Tajiri | G11C 13/0007 365/148 |
| 2008/0173932 | A1* | 7/2008 | Kidoh | H01L 27/11568 257/324 |
| 2010/0110758 | A1* | 5/2010 | Li | G11C 13/0007 365/148 |
| 2012/0217562 | A1* | 8/2012 | Lee | H01L 27/11521 257/314 |
| 2014/0328109 | A1* | 11/2014 | Murooka | G11C 8/10 365/148 |
| 2015/0028281 | A1* | 1/2015 | Chen | H01L 45/1253 257/4 |
| 2015/0102282 | A1 | 4/2015 | Zhang et al. | |
| 2015/0255717 | A1* | 9/2015 | Park | H01L 27/2436 438/382 |
| 2016/0071870 | A1* | 3/2016 | Minami | H01L 27/11582 257/314 |
| 2017/0033158 | A1* | 2/2017 | Vereen | H01L 45/08 |
| 2017/0084627 | A1* | 3/2017 | Lee | G11C 16/3427 |
| 2017/0117291 | A1* | 4/2017 | Or-Bach | H01L 23/5283 |

FOREIGN PATENT DOCUMENTS

| | | |
|---|---|---|
| JP | 2013016781 | 1/2013 |
| JP | 2013143536 | 7/2013 |

OTHER PUBLICATIONS

"Office Action of Japan Counterpart Application," dated Sep. 19, 2017, p1-p3, in which the listed references were cited.

* cited by examiner

THREE-DIMENSIONAL RESISTIVE MEMORY

BACKGROUND OF THE INVENTION

1. Field of the Invention

The present invention generally relates to a resistive memory and a method of forming the same, and generally to a three-dimensional resistive memory and a method of forming the same.

2. Description of Related Art

Resistive random access memory (RRAM) is one type of non-volatile memory. Due to numerous advantages of RRAM including simple structure, low operation voltage, rapid operation time, multi-bit storage, low cost, good durability, RRAM have been widely developed recently. The basic structure of commonly used RRAM is composed of one transistor and one resistor (1T1R), or one diode and one resistor (1D1R). The resistance value of the resistor is changed by varying the applied bias, so that the device is in a high resistance state or a low resistance state, and thereby 0 or 1 of the digital signal is recognized.

Non-volatile memory is expanding into a three-dimensional regime to effectively reduce the cell size by increasing stored bits per unit area. One common three-dimensional memory is a cross point array memory. However, the method of forming the cross point array memory is complicated and expensive because it requires repeated pattering of individual device layers. Moreover, the sneak current and accidental RESET or SET disturbance of non-selected memory cells occur, so the reliability of the device is decreased.

SUMMARY OF THE INVENTION

Accordingly, the present invention provides a three-dimensional resistive memory and a method of forming the same, in which a three-dimensional resistive memory is formed with a transistor device and a memory device connected to each other.

In an embodiment, the present invention provides a three-dimensional resistive memory including a channel pillar, a first gate pillar, a first gate dielectric layer, a first stacked structure, a second stacked structure, a variable resistance pillar and an electrode pillar. The channel pillar is disposed on a substrate. The first gate pillar is disposed on the substrate and at a first side of the channel pillar. The first gate dielectric layer is disposed between the channel pillar and the first gate pillar. The first stacked structure and a second stacked structure are disposed on the substrate and respectively at opposite second and third sides of the channel pillar, wherein each of the first stacked structure and the second stacked structure includes a plurality of conductive material layers and a plurality of insulating material layers alternately stacked. The variable resistance pillar is disposed on the substrate and at a side of the first stacked structure opposite to the channel pillar. The electrode pillar is disposed on the substrate and located inside of the variable resistance pillar.

According to an embodiment of the present invention, the conductive material layers include TiN or TaN.

According to an embodiment of the present invention, the electrode pillar includes, from outside to inside, an ion exchange layer, a barrier layer and an electrode layer.

According to an embodiment of the present invention, the ion exchange layer includes Ti, Al or Ta.

According to an embodiment of the present invention, the barrier layer includes titanium oxynitride or aluminum oxide.

According to an embodiment of the present invention, the electrode layer includes TiN or TaN.

According to an embodiment of the present invention, the three-dimensional resistive memory further includes an insulating pillar disposed on the substrate and located inside of the channel pillar.

According to an embodiment of the present invention, a sidewall of the first stacked structure connected to the variable resistance pillar has a plurality of recesses, and one of the plurality of recesses is located between two adjacent conductive material layers or between two adjacent insulating material layers.

According to an embodiment of the present invention, the three-dimensional resistive memory further includes a second gate pillar and a second gate dielectric layer. The second gate pillar is disposed on the substrate and at a fourth side of the channel pillar opposite to the first side. The second gate dielectric layer is disposed between the channel pillar and the second gate pillar.

According to an embodiment of the present invention, the three-dimensional resistive memory further includes a bit line and a word line. The bit line is electrically connected to the electrode pillar, the word line is electrically connected to at least one of the first gate pillar and the second gate pillar. At least one of the bit line and the word line has an extension direction across an extension direction of the second stacked structure.

In another embodiment, the present invention provides a three-dimensional resistive memory including a stacked structure, a first gate pillar, a first gate dielectric layer, a variable resistance and an electrode pillar. The stacked structure is disposed on the substrate and has a line portion and a protruding portion perpendicular to each other. The stacked structure includes a plurality of conductive material layers and a plurality of insulating material layers alternately stacked. The first gate pillar is disposed on the substrate and at a first side of the protruding portion. The first gate dielectric layer is disposed between the protruding portion and the first gate pillar. The variable resistance is disposed on the substrate and at a side of the protruding portion opposite to the line portion. The electrode pillar is disposed on the substrate and located inside of the variable resistance pillar.

According to an embodiment of the present invention, the conductive material layers include GaN or InGaAs.

In yet another embodiment, the present invention further provides a method of forming a three-dimensional resistive memory includes the following steps. A stacked structure is formed on a substrate, wherein the stacked structure includes a plurality of conductive material layers and a plurality of insulating material layers alternately stacked. A portion of the stacked structure is removed to expose the substrate and therefore form a first stacked portion and a second stacked portion connected to each other, wherein an extension direction of the first stacked portion is perpendicular to an extension direction of the second stacked portion. A first insulating layer is formed on the substrate aside the first stacked portion and the second stacked portion. A portion of the first insulating layer is removed to expose the substrate and therefore form a first opening, wherein the first opening is located at one side of the second stacked portion and separated from the second stacked portion with the first insulating layer. A first gate material layer is formed in the first opening. Another portion of the first insulating layer is removed to form a second opening, wherein the second stacked portion is located between the first stacked portion and the second opening. A variable resistance layer and an electrode material layer are sequentially formed on a sidewall of the second opening.

According to an embodiment of the present invention, the conductive material layers include GaN or InGaAs.

According to an embodiment of the present invention, the conductive material layers include TiN or TaN.

According to an embodiment of the present invention, the method further includes the following steps after the step of forming the first insulating layer and before the step of forming the first opening. A portion of the second stacked portion is removed to form a third opening and a third stacked portion, wherein the third opening is located between the first stacked portion and the third stacked portion. A channel material layer is formed in the third opening.

According to an embodiment of the present invention, after the step of forming the channel material layer in the third opening, the method further includes forming a second insulating layer inside of the channel material layer.

According to an embodiment of the present invention, during the step of removing the another portion of the first insulating layer to form the second opening, the method further includes forming a plurality of recesses on a sidewall of the second stacked portion connected to the variable resistance layer, wherein one of the recesses is between two adjacent conductive material layers or between two adjacent insulating material layers.

According to an embodiment of the present invention, the step of forming the electrode material layer includes forming, from outside to inside, an ion exchange layer, a barrier layer and an electrode layer in the second opening.

According to an embodiment of the present invention, during the step of forming the first opening, the method further includes the following steps. Yet another portion of the first insulating layer is removed to form a fourth opening, wherein the fourth opening is at a side of the second stacked portion opposite to the first opening and separated from the second stacked portion with the first insulating layer. A second gate material layer is formed in the fourth opening.

According to an embodiment of the present invention, after the step of sequentially forming the variable resistance layer and the electrode material layer on the sidewall of the second opening, the method further includes forming a bit line and a word line. The bit line is electrically connected to the electrode material layer. The word line is electrically connected to at least one of the first gate material layer and the second gate material layer. At least one of the bit line and the word line has an extension direction across an extension direction of the first stacked portion.

In view of the above, in the three-dimensional resistive memory of the present invention, a transistor device and a memory device are connected to each other, the transistor device includes transistor cells located at different levels, and the portion of the memory device adjacent to the corresponding transistor cell at each level serves as a memory cell. Therefore, during the operation of the three-dimensional resistive memory, the transistor cells at different levels can be individually controlled to suppress the sneak current and prevent accidental RESET or SET disturbance of non-selected memory cells from occurring. Besides, the method of forming such three-dimensional resistive memory is simple, and each of the gate pillar (e.g., gate material layer) shared by the transistor cells at different levels is formed in a single process step. Therefore, the process steps can be significantly reduced, and the process cost can be accordingly saved.

In an embodiment, each of the gate pillar (e.g., gate material layer) and the channel pillar (e.g., channel material layer) shared by the transistor cells at different levels is formed in a single process step. Therefore, the process steps can be significantly reduced, and the process cost can be accordingly saved.

In another embodiment, in the case without the foil cation of channel pillars, portions of the conductive material layers serve as channels of the transistor device. In this case, the conductive material layers can be composed of a high-mobility semiconductor such as gallium nitride (GaN) or indium gallium arsenide (InGaAs), so the operation speed of the transistor device is accordingly improved.

In order to make the aforementioned and other objects, features and advantages of the present invention comprehensible, the preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 to FIG. 5 are schematic top views of a method of forming a three-dimensional resistive memory according to a first embodiment of the present invention, wherein

DESCRIPTION OF THE EMBODIMENTS

Figure 1:
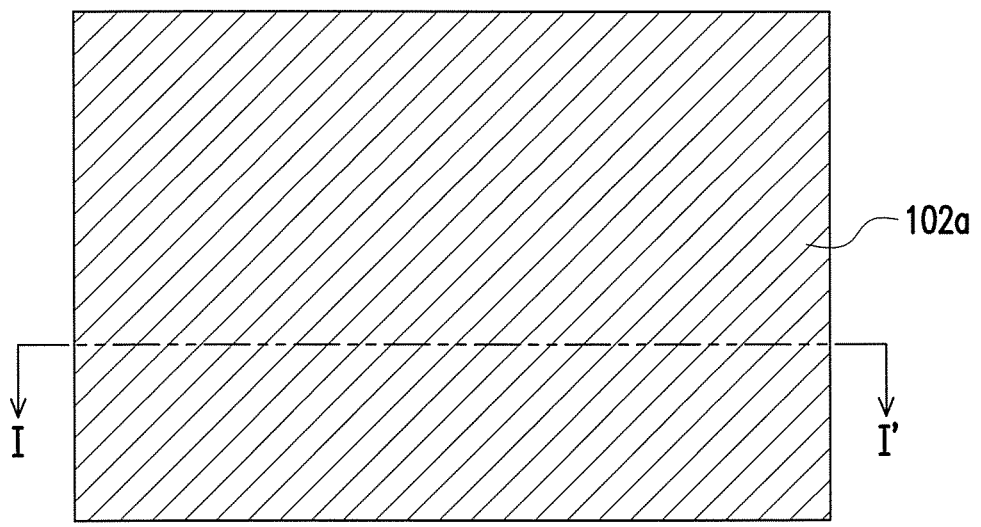

Reference will now be made in detail to the present preferred embodiments of the invention, examples of which are illustrated in the accompanying drawings. Wherever possible, the same reference numbers are used in the drawings and the description to refer to the same or like parts.

Figure 1A:
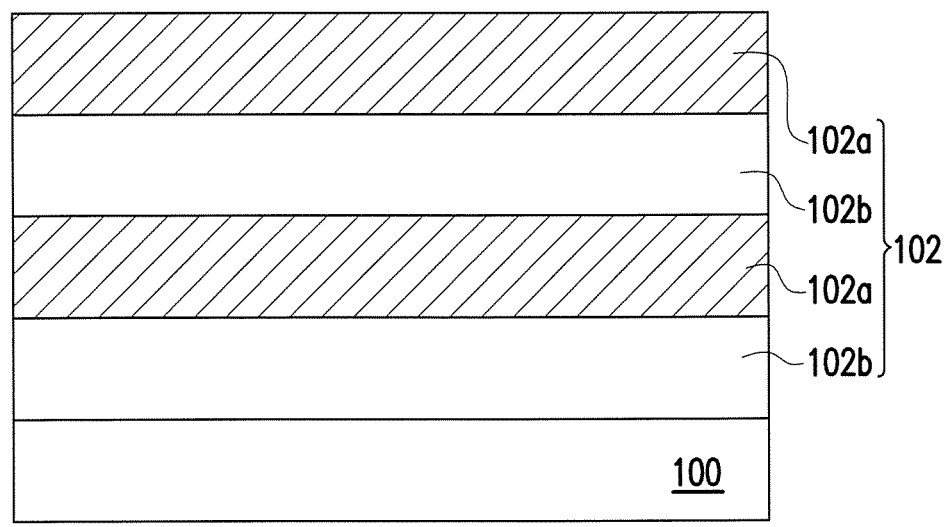
FIG. 1A is a schematic cross-sectional view taken along the line I-I' of FIG. 1.
Figure 3:
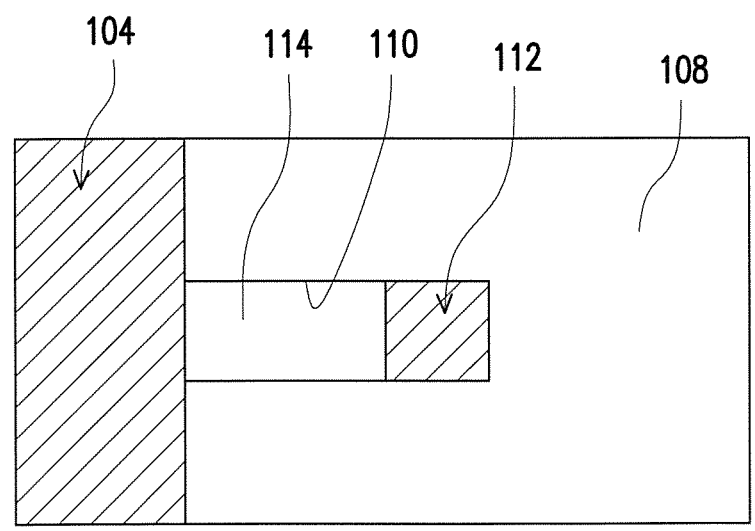
Figure 4:
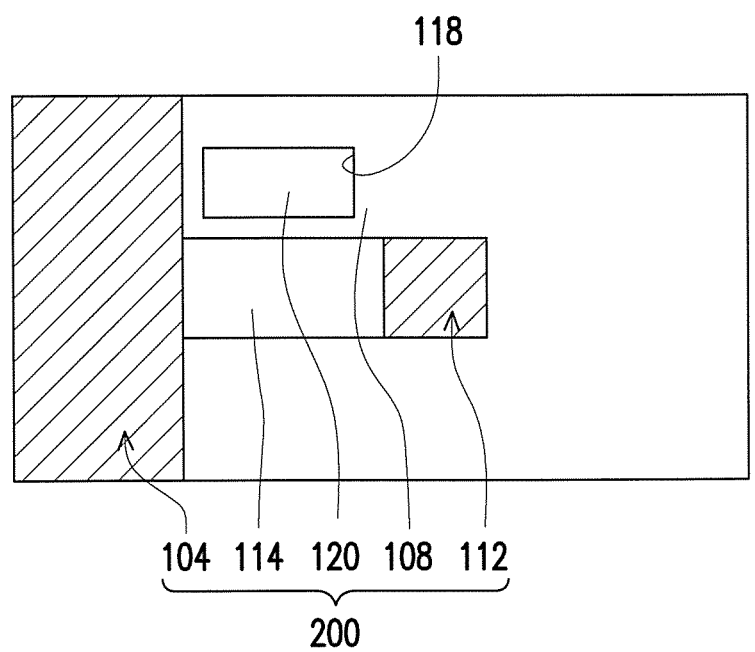
Figure 5:
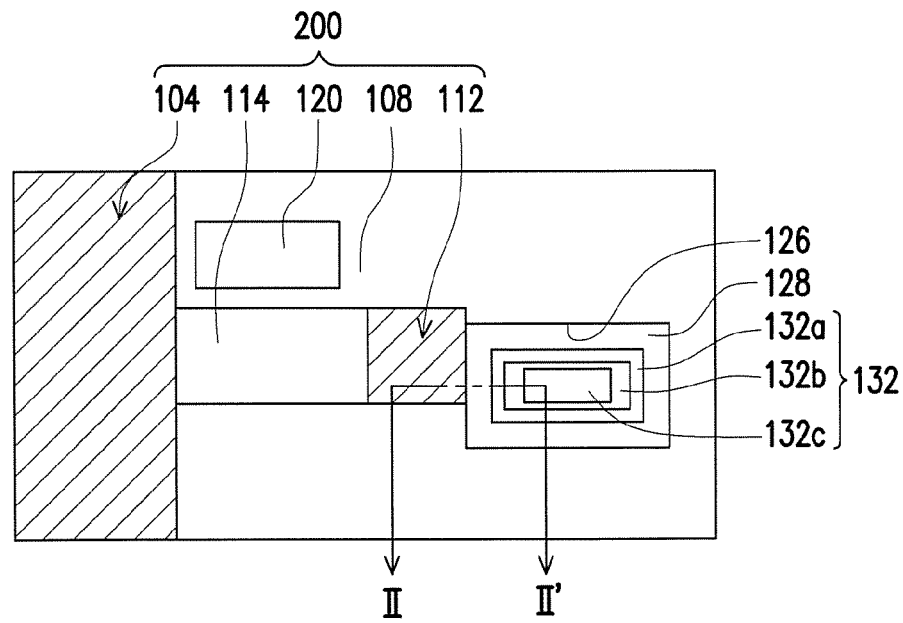
Figure 5A:
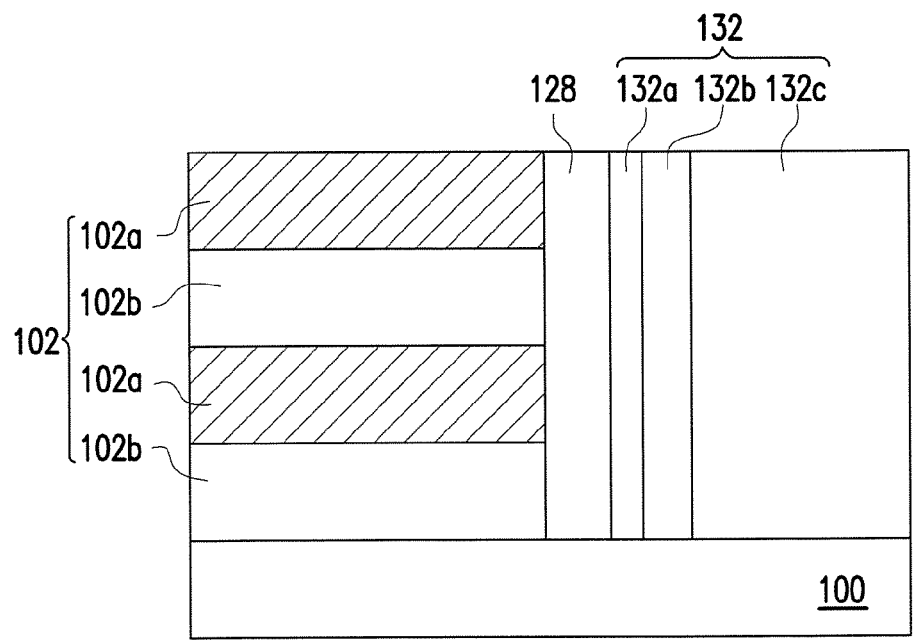
FIG. 5A is a schematic cross-sectional view taken along the line II-II' of FIG. 5.

FIG. 1 to FIG. 5 are schematic top views of a method of forming a three-dimensional resistive memory according to a first embodiment of the present invention, wherein FIG. 1A is a schematic cross-sectional view taken along the line I-I' of FIG. 1, and FIG. 5A is a schematic cross-sectional view taken along the line II-II' of FIG. 5.

Referring to FIG. 1 and FIG. 1A, a stacked structure 102 is formed on a substrate 100. In an embodiment, the substrate 100 includes a semiconductor substrate such as a silicon-containing substrate. In another embodiment, the substrate 100 includes a dielectric substrate. The stacked structure 102 includes a plurality of conductive material layers 102a and a plurality of insulating material layers 102b alternately stacked. The conductive material layers 102a include titanium nitride (TiN) or tantalum nitride (TaN). The insulating material layers 102b include silicon oxide. The method of forming the stacked structure 102 includes alternately forming the conductive material layers 102a and the insulating material layers 102b with multiple chemical vapour disposition (CVD) processes. This embodiment in which two conductive material layers 102a and two insulating material layers 102b are provided for illustration purposes, and is not construed as limiting the present invention. In other words, the numbers of the conductive material layers 102a and the insulating material layers 102b are not limited by the present invention. Besides, in this embodiment, the lowermost layer of the stacked structure 102 is one insulating material layer 102b and the topmost layer of the same is one conductive material layer 102a. However, the present invention is not limited thereto. In another embodiment, in the case that the substrate 100 is a dielectric substrate, the lowermost layer of the stacked structure 102 can be one conductive material layer 102a and the topmost layer of the same can be one insulating material layer 102b.

Figure 2:
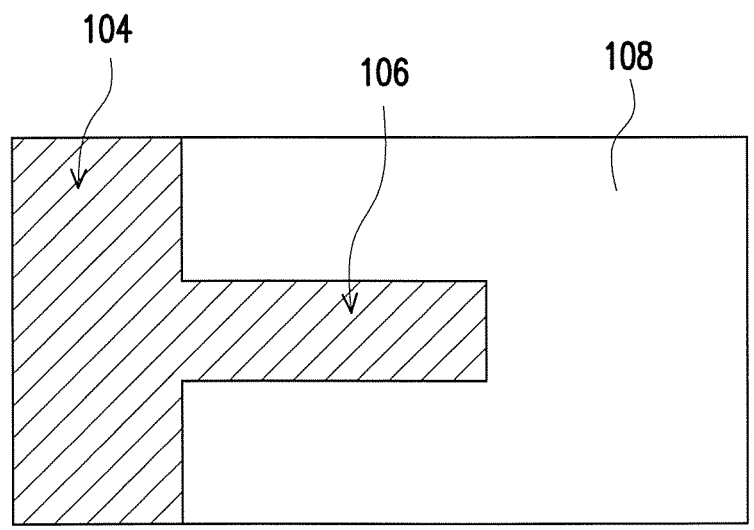

Referring to FIG. 2, a portion of stacked structure 102 is removed to expose the substrate 100 and therefore form a stacked portion 104 and a stacked portion 106. The method of removing the portion of stacked structure 102 includes performing a dry etching process. The extension direction of the stacked portion 104 is perpendicular to the extension direction of the stacked portion 106. Thereafter, an insulating layer 108 is formed on the substrate 100 aside the stacked portion 104 and the stacked portion 106. The insulating layer 108 includes silicon oxide, and the forming method thereof includes performing a CVD process.

Referring to FIG. 3, a portion of stacked portion 106 is removed to form an opening 110 that exposes the substrate 100 and a stacked portion 112. The opening 110 is located between the stacked portion 104 and the stacked structure 112. The method of removing the portion of the stacked portion 106 includes performing a dry etching process. Afterwards, a channel material layer 114 is formed in the opening 110. The channel material layer 114 includes amorphous silicon, polysilicon or both and may be doped or undoped, and the forming method thereof includes performing a CVD process. In this embodiment, the channel material layer 114 can completely fill the opening 110.

Referring to FIG. 4, a portion of insulating layer 108 is removed to form an opening 118 that exposes the substrate 100. The method of removing the portion of the insulating layer 108 includes performing a dry etching process. In this step, the portion of the insulating layer 108 at one side of the channel material layer 114 is removed to from the opening 118 that is not in physical contact with the channel material layer 114. Specifically, the opening 118 is separated or insulated from the channel material layer 114 with the insulating layer 108. Thereafter, a gate material layer 120 is formed in the opening 118. The fabrication of the transistor device 200 of this embodiment is thus completed. In the transistor device 200 of this embodiment, the gate material layer 120 serves as a gate, the channel material layer 114 serves as a channel region, and the insulating layer 108 between the gate material layer 120 and the channel material layer 114 serves as a gate dielectric layer. Besides, each of the conductive material layers 102a in the stacked portion 104 or the stacked structure 112 adjacent to the channel material layer 114 can serve as a source/drain region of the transistor device 200.

Besides, the transistor device 200 includes multiple transistor cells at different levels. Each transistor cell includes one conductive material layer 102a of the stacked portion 104 at a level, the corresponding conductive material layer 102a of the stacked portion 112 at the same level, and the channel material layer 114 and the gate material layer 120 located therebetween. These transistor cells are insulated from each other with the insulating material layers 102b of the stacked portion 104 and the stacked portion 112.

In this embodiment, a laser annealing process can be optionally performed before the step of forming the gate material layer 120 in the opening 118. The laser annealing process can be a low thermal budget annealing that can localize the thermal budget in the channel material layer 114. Such low thermal budget annealing can keep the three-dimensional patterned structure integrity and avoid adjacent dielectric materials from mixing with polysilicon in the channel material layer 114. Therefore, polysilicon can be grown uniformly with larger grains having low defects and high mobility in the channel material layer 114, and the transistor device 200 is accordingly provided with low leakage and high "ON" current.

In addition, in this embodiment, the channel material layer 114 is formed prior to the formation of the gate material layer 120, so the gate material layer 120 as a transistor gate is free of damage during the step of defining the channel material layer 114, and the reliability of the transistor device 200 is therefore improved.

Referring to FIG. 5 and FIG. 5A, another portion of the insulating layer 108 at one side of the stacked portion 112 is removed to form an opening 126, and thus, the stacked portion 112 is located the channel material layer 114 and the opening 126. The method of removing the another portion of insulating layer 108 includes performing a dry etching process. Thereafter, a variable resistance layer 128 and an electrode material layer 132 are sequentially formed on the sidewall of the opening 126. The method of forming each of the variable resistance layer 128 and the electrode material layer 132 includes performing a CVD process or an atomic layer deposition (ALD) process. In this embodiment, the step of forming the electrode material layer 132 includes forming, from outside to inside of the opening 126, an ion exchange layer 132a, a barrier layer 132b and an electrode layer 132c. In an embodiment, the ion exchange layer 132a can be an oxygen exchange layer. The ion exchange layer 132a includes Ti, Al or Ta. The barrier layer 132b includes titanium oxynitride (TiON) or aluminum oxide ($Al_2O_3$). The electrode layer 132c includes TiN or TaN. The memory device 300 of this embodiment is thus completed. In the memory device 300 of this embodiment, the variable resistance layer 128 serves as a variable resistance pillar, and the electrode material layer 132 serves as an electrode pillar.

In this embodiment, during the step of removing the another portion of the insulating layer 108 to formed the opening 126, an etchant having a similar etching rate for the conductive material layers 102a or the insulating material layers 102b is used in combination with adjustments of etching parameters, so the opening 126 is formed with a substantially vertical sidewall or a smooth sidewall.

Figure 6:
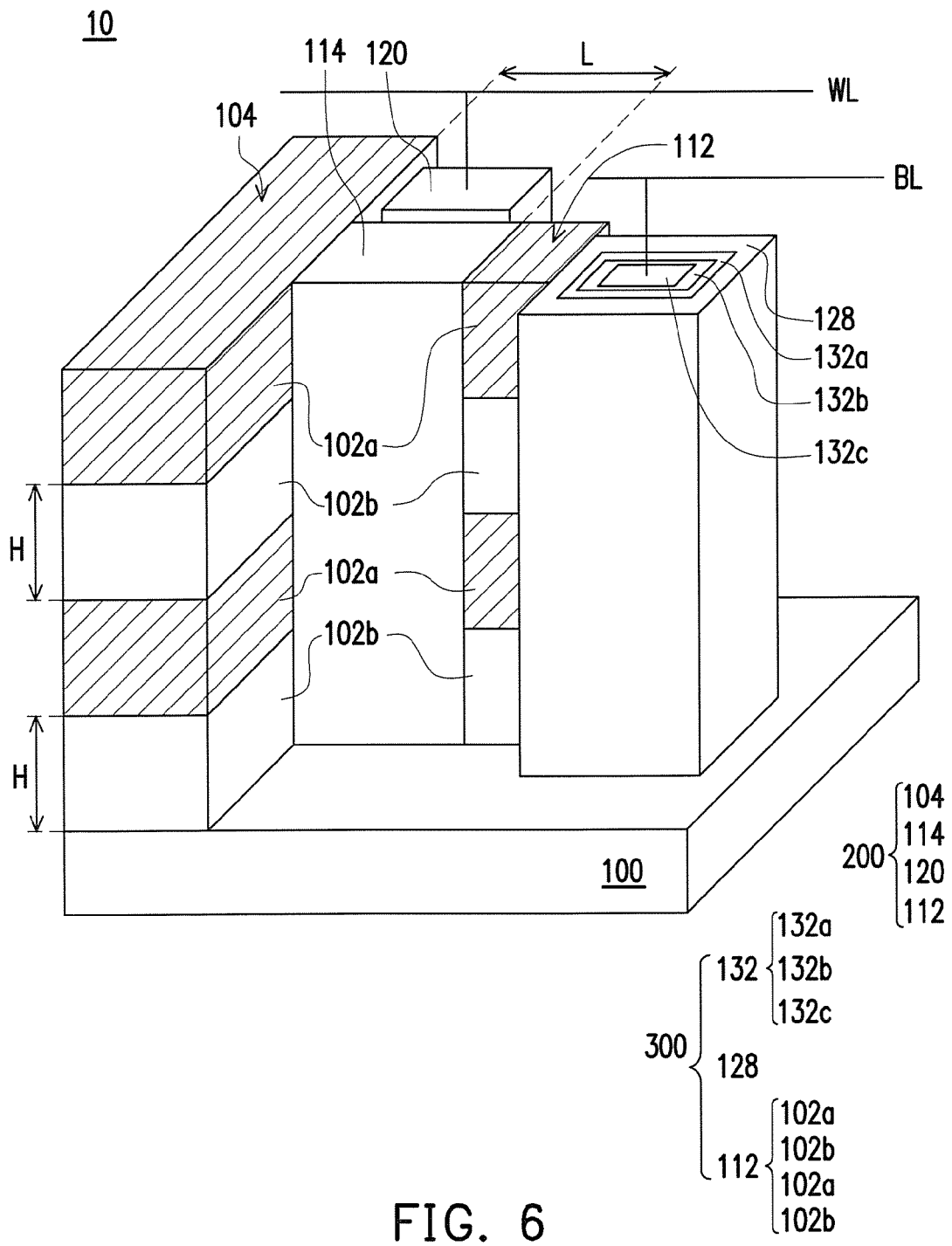
FIG. 6 is a schematic respective view of a three-dimensional resistive memory according to the first embodiment of the present invention.

Referring to FIG. 6 in which the insulating layer 108 is not shown for clarity of illustration, a bit line BL is formed to electrically connect to electrode material layer 132 and a word line WL is formed to electrically connect to the gate material layer 120, wherein the extension direction of each of the bit line BL and the word line WL is across the extension direction of the stacked portion 104. The three-dimensional resistive memory 10 of this embodiment is thus completed. The method of forming the bit line BL and the word line WL is known to people having ordinary skill in the art, so the details are not iterated herein.

Besides, in the three-dimensional resistive memory 10, each of the insulating material layers 102b has a thickness H, and the stacked portion 104 and the stacked portion 112 has a distance L (i.e. channel length) therebetween. In this embodiment, the thickness H is about 10 times the distance L or more, so as to prevent crosstalk between different levels of the transistor cells, and therefore to increase the reliability of the transistor device 200. Specifically, the distance between levels (i.e., the thickness H of each insulating material layer 102b) is large enough to suppress the current leaking between levels.

In the three-dimensional resistive memory 10, the portion of the memory device 300 adjacent to the corresponding transistor cell at each level serves as a memory cell. Therefore, during the operation of the three-dimensional resistive memory 10, the transistor cells at different levels can be individually controlled to suppress the sneak current and therefore prevent accidental RESET or SET disturbance of non-selected memory cells from occurring, so the reliability degradation of the three-dimensional resistive memory 10 is not observed. Besides, in the three-dimensional resistive memory 10 of this embodiment, the gate material layer 120 shared by the transistor cells at different levels is formed in a single process step. Similarly, the channel material layer 114 shared by the transistor cells at different levels is formed in a single process step. By such manner, the three-dimensional resistive memory 10 of this embodiment is formed with fewer process steps as compared to those of forming the conventional cross point array memory.

Figure 7A:
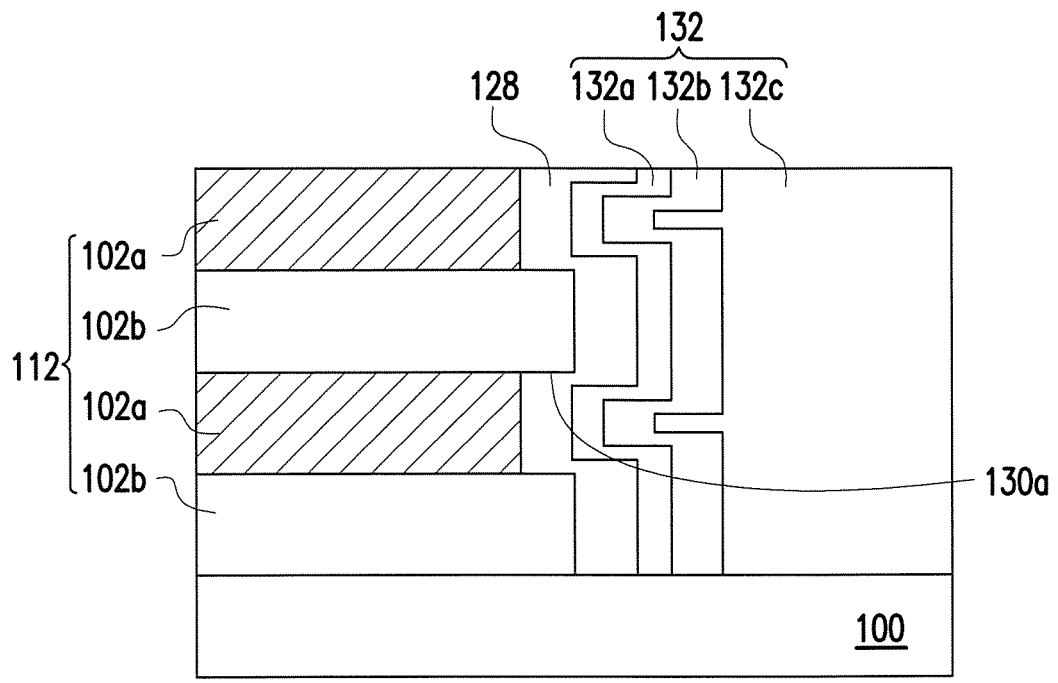
FIG. 7A is a schematic cross-sectional view of a variable resistance pillar and an electrode pillar of a three-dimensional resistive memory according to a second embodiment of the present invention.

FIG. 7A is a schematic cross-sectional view of a variable resistance pillar and an electrode pillar of a three-dimensional resistive memory according to a second embodiment of the present invention.

Referring to FIG. 7A and FIG. 5A, the difference between the second embodiment and the first embodiment lies in that in the second embodiment, the sidewall of the stacked portion 112 connected to the variable resistance layer 128 has a plurality of recesses 130a, and one of recesses 130a is located between two adjacent insulating material layers 102b. Specifically, in the second embodiment, during the step of removing the another portion of the insulating layer 108 to form the opening 126, the recesses 130a are simultaneously formed between the insulating material layers 102b. The method of forming the recesses 130a includes using an etchant having an etching rate for the conductive material layers 102a faster than the insulating material layers 102b during the step of forming the opening 126. After the step of forming the recesses 130a, as shown in FIG. 5A, a variable resistance layer 128 and an electrode material layer 132 are sequentially formed on the sidewall of the opening 126. In this embodiment, the recesses 130a are provided to hinder oxygen vertical diffusion or motion in the ion exchange layer 132a, and therefore prevent crosstalk of different memory cells in a vertical direction.

Figure 7B:
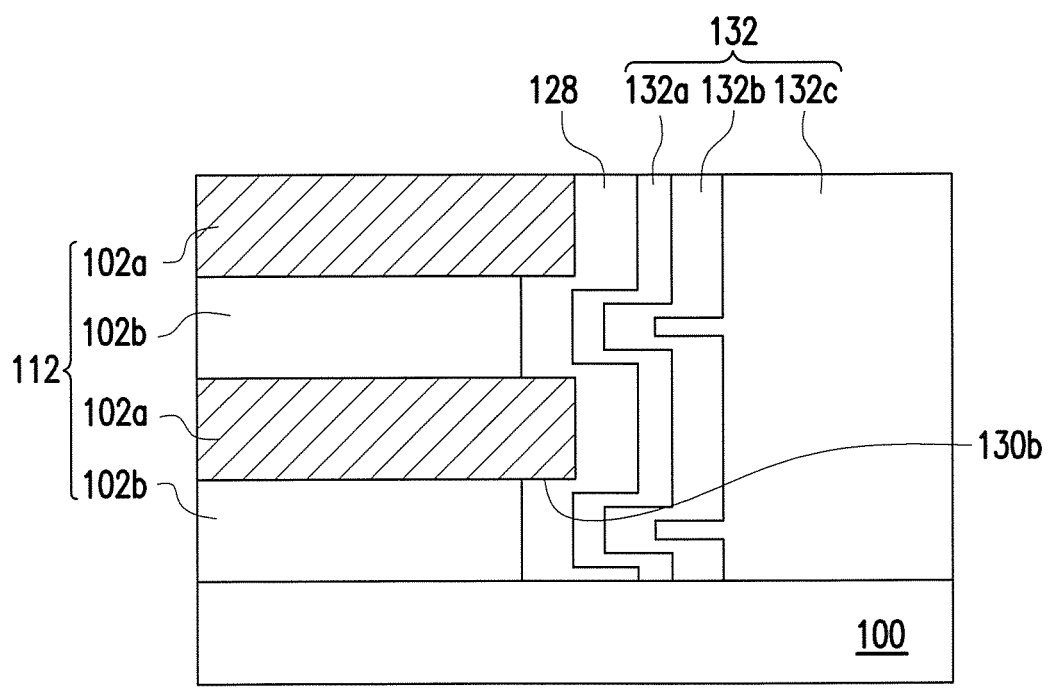
FIG. 7B is a schematic cross-sectional view of a variable resistance pillar and an electrode pillar of a three-dimensional resistive memory according to a third embodiment of the present invention.

FIG. 7B is a schematic cross-sectional view of a variable resistance pillar and an electrode pillar of a three-dimensional resistive memory according to a third embodiment of the present invention.

Referring to FIG. 7B, the difference between the third embodiment and the second embodiment lies in that in the third embodiment, the sidewall of the stacked portion 112 connected to the variable resistance layer 128 has a plurality of recesses 130b, and one of recesses 130b is located between two adjacent conductive material layers 102a. Specifically, in the third embodiment, during the step of removing the another portion of the insulating layer 108 to form the opening 126, the recesses 130b are simultaneously formed between the conductive material layers 102a. The method of forming the recesses 130b includes using an etchant having an etching rate for the conductive material layers 102a slower than the insulating material layers 102b during the step of forming the opening 126. Similar to the recesses 130a of the second embodiment, the recesses 130b of the third embodiment are provided to prevent crosstalk of different memory cells in a vertical direction.

FIG. 8 to FIG. 12 are schematic respective views of three-dimensional resistive memories according to fourth to eighth embodiments of the present invention.

Figure 8:
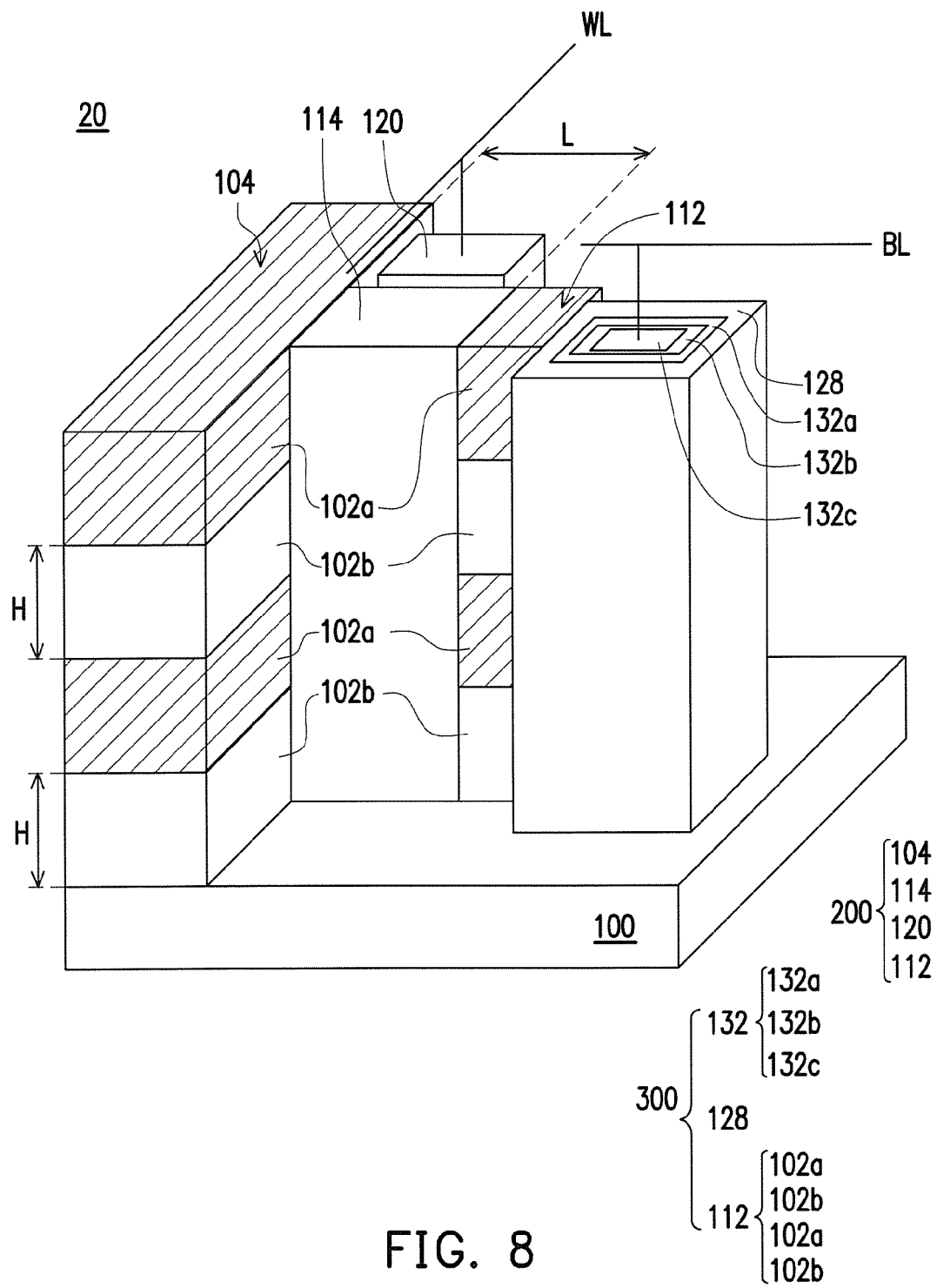
FIG. 8 to FIG. 12 are schematic respective views of three-dimensional resistive memories according to fourth to seventh embodiments of the present invention.

Referring to FIG. 8 in which the insulating layer 108 is not shown for clarity of illustration, in the fourth embodiment, the difference between the three-dimensional resistive memory 20 and the three-dimensional resistive memory 10 lies in that in the three-dimensional resistive memory 20, the extension direction of the word line WL is parallel to the extension direction of the stacked portion 104.

Figure 9:
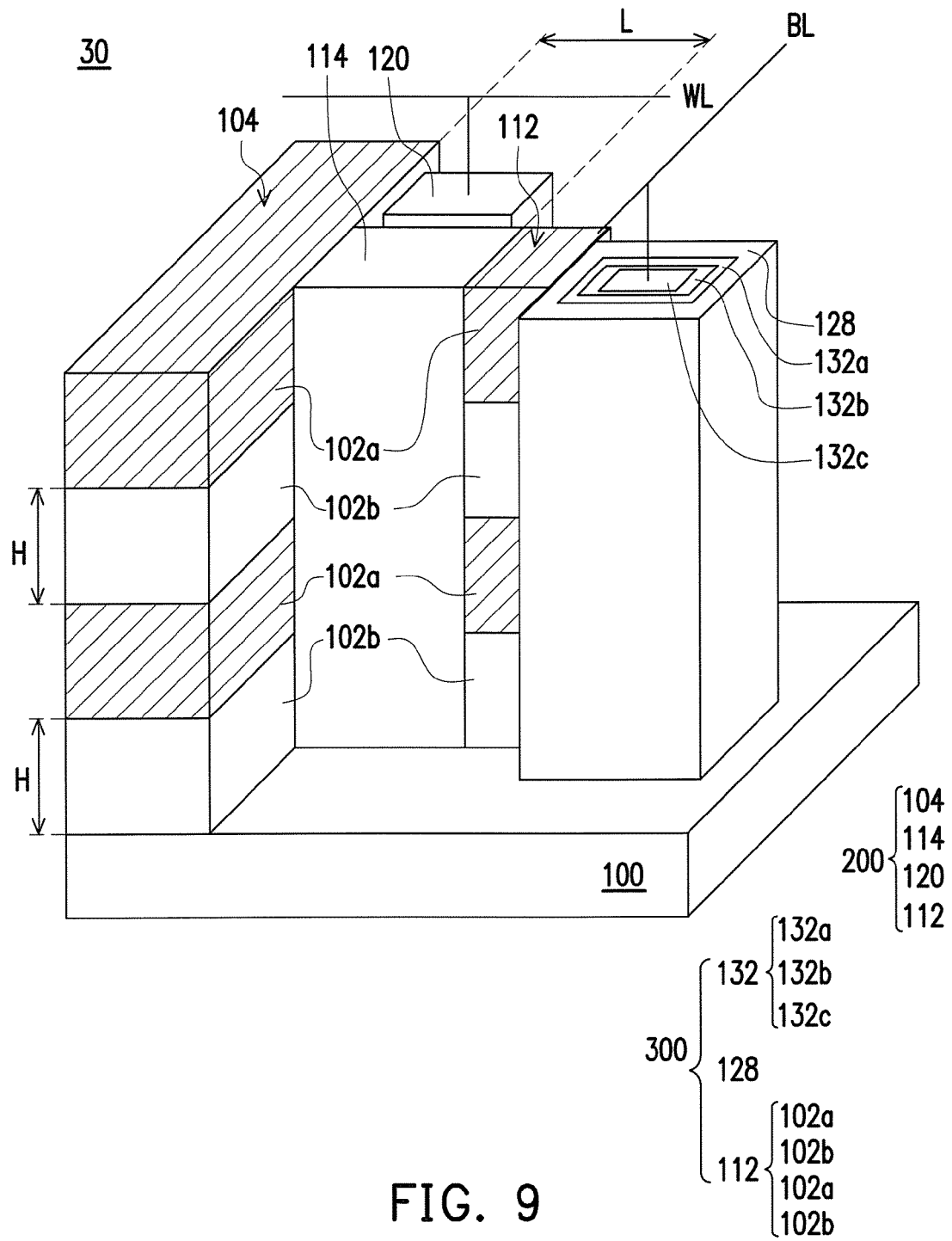

Referring to FIG. 9 in which the insulating layer 108 is not shown for clarity of illustration, in the fifth embodiment, the difference between the three-dimensional resistive memory 30 and the three-dimensional resistive memory 10 lies in that in the three-dimensional resistive memory 30, the extension direction of the bit line BL is parallel to the extension direction of the stacked portion 104.

Figure 10:
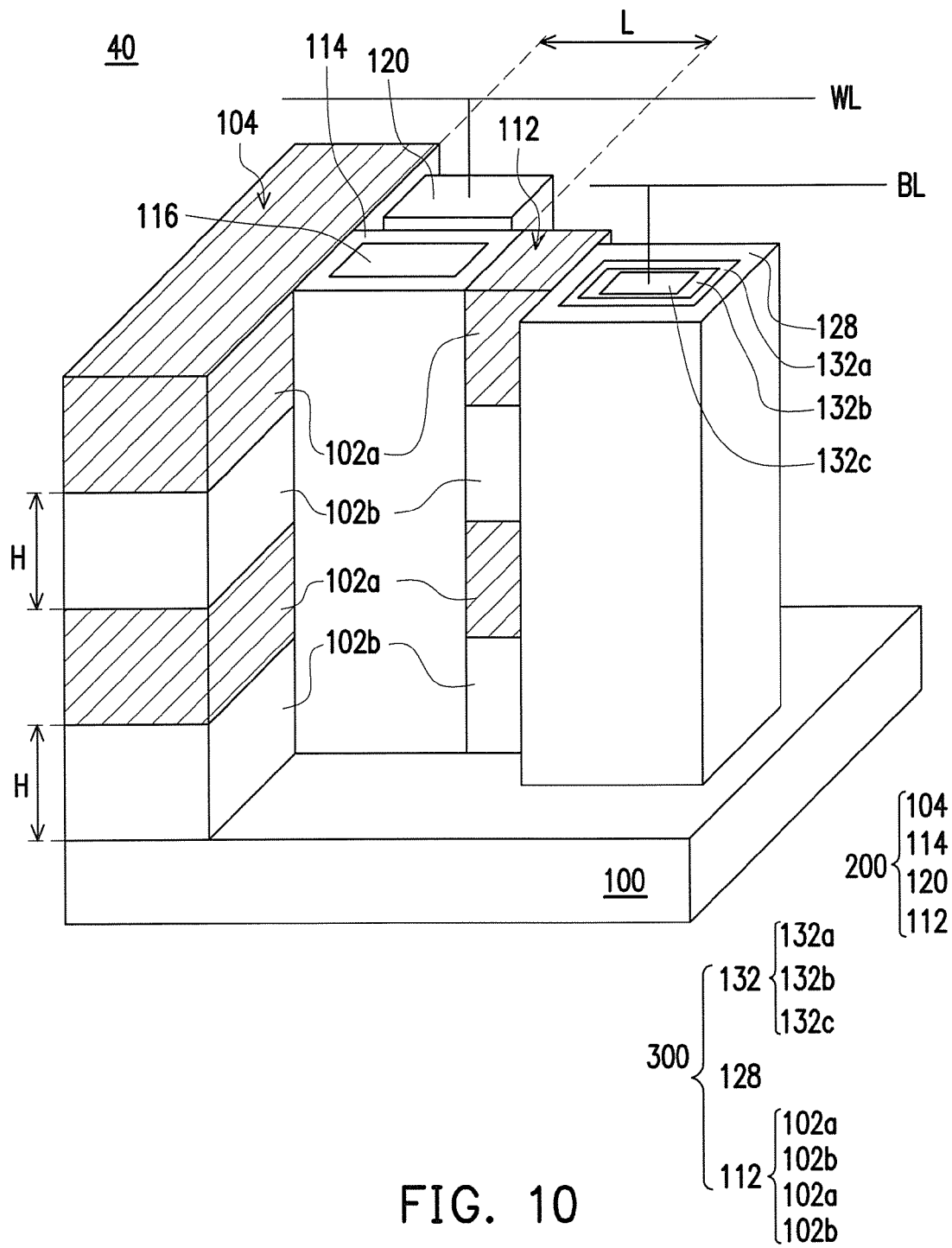

Referring to FIG. 10 in which the insulating layer 108 is not shown for clarity of illustration, in the sixth embodiment, the difference between the three-dimensional resistive memory 40 and the three-dimensional resistive memory 10 lies in that in the three-dimensional resistive memory 40, an insulating layer 116 is further included in the transistor device 200 and is disposed inside of the channel material layer 114. Specifically, in this embodiment, after the step of removing the portion of stacked portion 106 to form the opening 110 that exposes the substrate 100 and the stacked portion 112 (as shown in FIG. 3), a channel material layer 114 is formed on the sidewall of the opening 110, and the channel material layer 114 does not completely fill the opening 110. Thereafter, an insulating layer 116 is formed in the opening 110. The method of forming the insulating layer 116 includes performing a CVD process.

In this embodiment, disposing the insulating layer 116 in the channel material layer 114 has the effect of thinning the channel of the transistor device 200, therefore reducing the OFF-state leakage, which tends to become severe for short channels.

Figure 11:
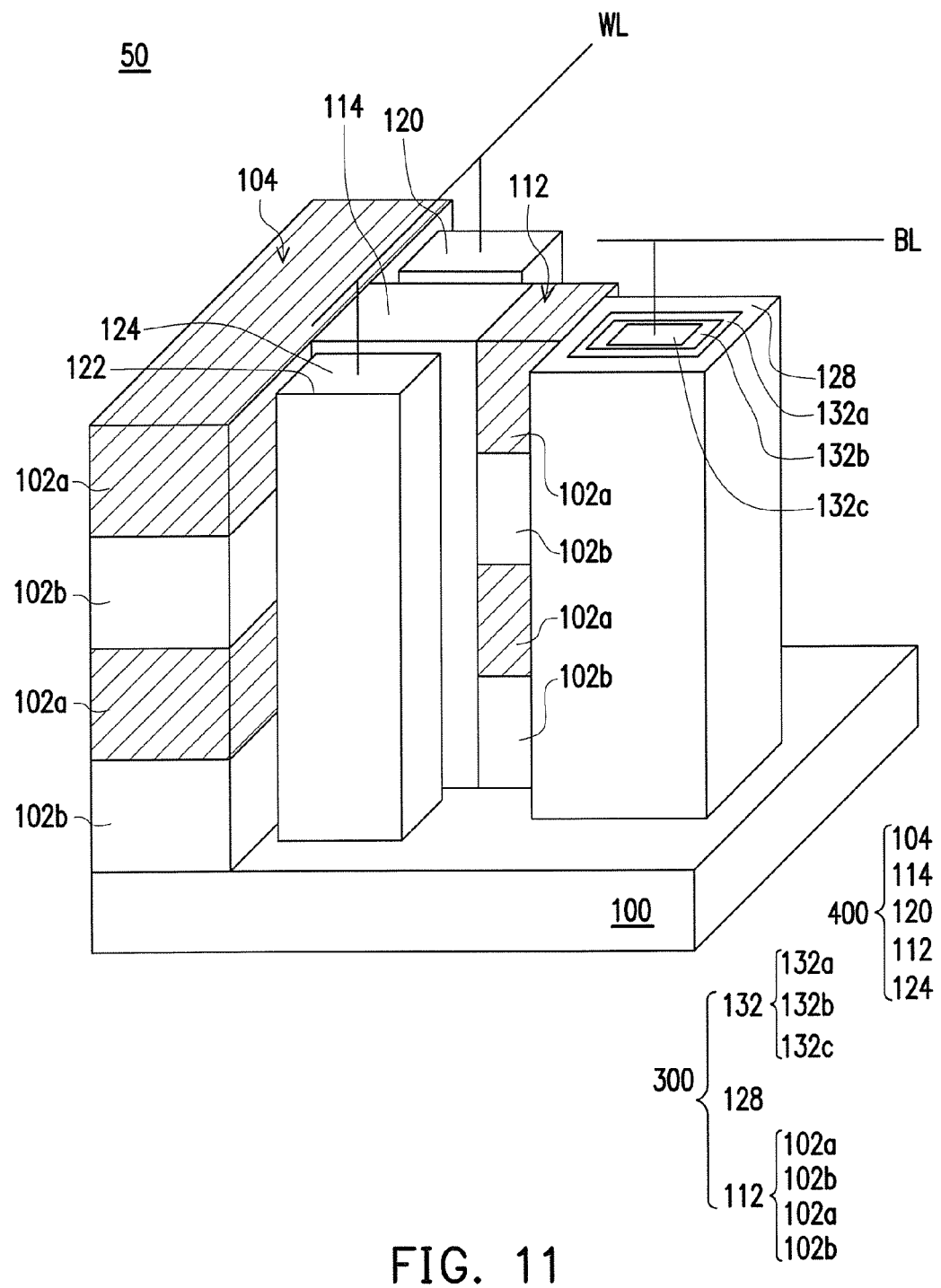

Referring to FIG. 11 in which the insulating layer 108 is not shown for clarity of illustration, in the seventh embodiment, the difference between the three-dimensional resistive memory 50 and the three-dimensional resistive memory 10 lies in that in the three-dimensional resistive memory 50, the transistor device 400 further includes a second gate pillar (e.g., gate material layer 124) in addition to the first gate pillar (e.g., gate material layer 120). The second gate pillar is disposed on the substrate 100 and at one side of the channel pillar (e.g., channel material layer 114) opposite to the one side. In this embodiment, the first channel pillar (e.g., channel material layer 114) and the second gate pillar (e.g., gate material layer 124) are disposed at opposite sides of the channel pillar (e.g., channel material layer 114). Specifically, in this embodiment, during the step of removing a portion of the insulating layer 108 to forming the opening 118 (as shown in FIG. 4), yet another portion of the insulating layer 108 is removed to form an opening 122. The opening 122 is at a side of the channel material layer 114 opposite to the opening 118 and separated from the channel material layer 114 with the insulating layer 108. Thereafter, a gate material layer 124 (i.e., the second gate pillar) is formed in the opening 122. In this embodiment, the transistor device 400 is provided with a dual-gate structure, so the short channel effect is further prevented.

Figure 12:
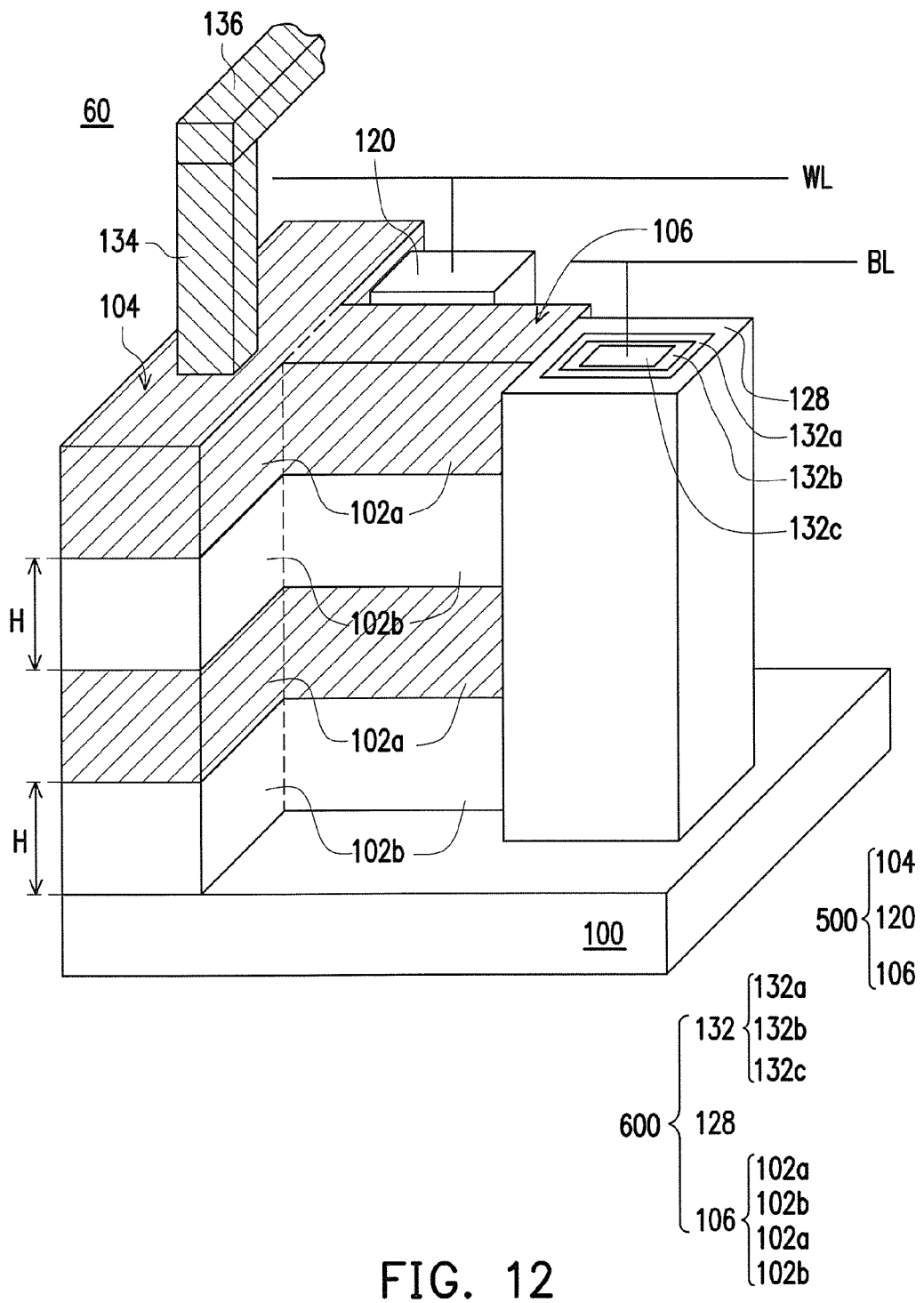

Referring to FIG. 12 in which the insulating layer 108 is not shown for clarity of illustration, in the eighth embodiment, the difference between the three-dimensional resistive memory 60 and the three-dimensional resistive memory 10 lies in that, the stacked portion 106 of the eighth embodiment replaces the channel material layer 114 and the stacked portion 112 of the transistor device 200 of the first embodiment. The stacked structure of the eighth embodiment has a line portion (e.g., stacked portion 104) and a protruding portion (e.g., stacked portion 106) perpendicular to each other. The stacked structure of the eighth embodiment includes a plurality of conductive material layers 102a and a plurality of insulating material layers 102b alternately stacked, and the conductive material layers 102a include GaN.

Besides, the three-dimensional resistive memory 60 is electrically connected to an external circuit through a metal strap line 136 and a via 134. The metal strap line 136 is disposed over the stacked portion 104 and is electrically connected to the stacked portion 104 through the via 134.

Specifically, in the eighth embodiment, the step of FIG. 3 is not performed. That is, the step of removing a portion of stacked portion 106 to form an opening 110 that exposes the substrate 100 and a stacked portion 112 is omitted in the eighth embodiment.

As shown in FIG. 12, the three-dimensional resistive memory 60 is provided after the step of forming a variable resistance layer 128 and an electrode material layer 132 (e.g. the step of FIG. 5). Thereafter, an interlayer insulating layer (not shown) is formed on the stacked portion 104 and then patterned to form a via opening (not shown) that exposing a portion of the stacked portion 104. A via 134 is then formed in the via opening. Afterwards, a metal strap line 136 is formed on and electrically connected to the via 134.

In this embodiment, the three-dimensional resistive memory 60 includes a transistor device 500 and a memory device 600, wherein the gate material layer 120 of the transistor device 500 serves as a gate, and the insulating layer 108 between the gate material layer 120 and the stacked portion 106 serves as a gate dielectric layer. Besides, in the transistor device 500, a portion of each conductive material layer 102a in the stacked portion 106 adjacent to the gate material layer 120 can serve as a channel, another portion of each conductive material layer 102a in the stacked portion 106 away from the stacked portion 104 can serve as a source/drain region (e.g., drain region), and each conductive material layer 102a in the stacked portion 104 can serve as a source/drain region (e.g., source line).

In this embodiment, the memory device 600 is constituted by a portion of each conductive material layer 102a in the stacked portion 106 adjacent to the variable resistance layer 128, the variable resistance layer 128 and the electrode material layer 132.

In this embodiment, the transistor cells at different levels are isolated by the insulating material layers 102b, so they can be individually controlled, during the operation of the three-dimensional resistive memory 60, to suppress the sneak current and therefore prevent accidental RESET or SET disturbance of non-selected memory cells from occurring. Besides, the conductive material layers can be composed of a high-mobility semiconductor such as gallium nitride (GaN) or indium gallium arsenide (InGaAs), so the operation speed of the transistor device 500 is accordingly improved. Moreover, by disposing the metal strap line and the via, the resistance in the signal transferring path between the transistor device 500 and the external circuit can be further reduced.

In summary, the present invention provides a the three-dimensional resistive memory including a transistor device and a memory device that are connected to each other, wherein the transistor device includes transistor cells located at different levels, and the portion of the memory device adjacent to the corresponding transistor cell at each level serves as a memory cell. Therefore, during the operation of the three-dimensional resistive memory, the transistor cells at different levels can be individually controlled to suppress the sneak current and therefore prevent accidental RESET or SET disturbance of non-selected memory cells from occurring. Besides, the transistor cells at different levels are insulated by insulating material layer(s), so as to prevent crosstalk between different levels of the transistor cells.

In the method of forming the three-dimensional resistive memory of the present invention, the gate pillar (e.g., gate material layer) shared by the transistor cells at different levels is formed in a single process step. By such manner, the process steps can be significantly reduced, and the process cost can be accordingly saved. In an embodiment, the gate pillar (e.g., gate material layer) and the channel pillar (e.g., channel material layer) shared by the transistor cells at different levels is formed in a single process step, so the process steps and the process cost can be further reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A three-dimensional resistive memory, comprising:
a channel pillar, disposed on a substrate;
a first gate pillar, disposed on the substrate and at a first side of the channel pillar;
a first gate dielectric layer, disposed between the channel pillar and the first gate pillar;
a first stacked structure and a second stacked structure, disposed on the substrate and respectively at opposite second and third sides of the channel pillar, wherein each of the first stacked structure and the second stacked structure comprises a plurality of conductive material layers and a plurality of insulating material layers alternately stacked;
a variable resistance pillar, disposed on the substrate and at a side of the first stacked structure opposite to the channel pillar; and
an electrode pillar, disposed on the substrate and located inside of the variable resistance pillar.

2. The three-dimensional resistive memory of claim 1, wherein the conductive material layers comprise TiN or TaN.

3. The three-dimensional resistive memory of claim 1, wherein the electrode pillar comprises, from outside to inside, an ion exchange layer, a barrier layer and an electrode layer.

4. The three-dimensional resistive memory of claim 3, wherein the ion exchange layer comprises Ti, Al or Ta.

5. The three-dimensional resistive memory of claim 3, wherein the barrier layer comprises titanium oxynitride or aluminum oxide.

6. The three-dimensional resistive memory of claim 3, wherein the electrode layer comprises TiN or TaN.

7. The three-dimensional resistive memory of claim 1, further comprising an insulating pillar disposed on the substrate and located inside of the channel pillar.

8. The three-dimensional resistive memory of claim 1, wherein a sidewall of the first stacked structure connected to the variable resistance pillar has a plurality of recesses, and one of the plurality of recesses is located between two adjacent conductive material layers or between two adjacent insulating material layers.

9. The three-dimensional resistive memory of claim 1, further comprising:
   a bit line; and
   a word line,
   wherein the bit line is electrically connected to the electrode pillar, the word line is electrically connected to the first gate pillar, at least one of the bit line and the word line has an extension direction across an extension direction of the second stacked structure.

10. The three-dimensional resistive memory of claim 1, further comprising:
    a second gate pillar, disposed on the substrate and at a fourth side of the channel pillar opposite to the first side; and
    a second gate dielectric layer, disposed between the channel pillar and the second gate pillar.

11. The three-dimensional resistive memory of claim 10, further comprising:
    a bit line; and
    a word line,
    wherein the bit line is electrically connected to the electrode pillar, the word line is electrically connected to the second gate pillar, and at least one of the bit line and the word line has an extension direction across an extension direction of the second stacked structure.

12. A three-dimensional resistive memory, comprising:
    a stacked structure, disposed on the substrate and having a line portion and a protruding portion perpendicular to each other, wherein the stacked structure comprises a plurality of conductive material layers and a plurality of insulating material layers alternately stacked;
    a first gate pillar, disposed on the substrate and at a first side of the protruding portion;
    a first gate dielectric layer, disposed between the protruding portion and the first gate pillar;
    a variable resistance pillar, disposed on the substrate and at a side of the protruding portion opposite to the line portion; and
    an electrode pillar, disposed on the substrate and located inside of the variable resistance pillar.

13. The three-dimensional resistive memory of claim 12, wherein the conductive material layers comprise GaN or InGaAs.

* * * * *